United States Patent
Yoshida

[11] Patent Number: 6,154,474
[45] Date of Patent: Nov. 28, 2000

[54] LASER DIODE OPTICAL WAVELENGTH CONTROL APPARATUS

[75] Inventor: Toshiro Yoshida, Tokyo, Japan

[73] Assignee: NEC Corporation, Tokyo, Japan

[21] Appl. No.: 09/225,005

[22] Filed: Jan. 4, 1999

[30] Foreign Application Priority Data

Jan. 5, 1998 [JP] Japan ................................. 10-000441

[51] Int. Cl.⁷ ............................................. H01S 5/0687
[52] U.S. Cl. .................................. 372/38; 372/32; 372/34
[58] Field of Search .................................. 372/32–36, 38

[56] References Cited

U.S. PATENT DOCUMENTS

| | | | |
|---|---|---|---|
| 4,583,228 | 4/1986 | Brown et al. | 372/32 |
| 4,631,728 | 12/1986 | Simons | 372/38 |
| 5,088,098 | 2/1992 | Muller et al. | 372/34 |
| 5,118,964 | 6/1992 | McArdle | 372/34 X |
| 5,602,860 | 2/1997 | Masonson | 372/34 |

FOREIGN PATENT DOCUMENTS

| | | |
|---|---|---|
| 58-171880 | 10/1983 | Japan . |
| 59-201239 | 11/1984 | Japan . |
| 6-310796 | 11/1994 | Japan . |
| 7-7212 | 1/1995 | Japan . |
| 7-307516 | 11/1995 | Japan . |
| 8-37334 | 2/1996 | Japan . |
| 9-121070 | 5/1997 | Japan . |

OTHER PUBLICATIONS

Japanese Office Action dated Aug. 31, 1999, with partial translation.
European Search Report dated Aug. 5, 1999.

*Primary Examiner*—John D. Lee
*Attorney, Agent, or Firm*—McGinn & Gibb, P.C.

[57] ABSTRACT

In an optical wavelength control apparatus for a laser diode, an optical branching circuit branches a laser beam from the laser diode into first, second, and third branched laser beams. An optical band-pass filter and optical low- and high-pass filters receive the first, second, and third branched laser beams and transmit laser beams having specific optical wavelengths therethrough as transmitted beams. First, second, and third photodiodes convert output beams from these filters into electrical signals and output them as analog voltages. A comparison amplifier compares the analog voltages output from the second and third photodiodes and outputs a comparison result signal. An operational amplifier performs differential amplification of a reference analog voltage from the first photodiode and the output signal from the comparison amplifier, and outputs a control signal. A temperature adjustment element is in tight contact with the laser diode and generates heat, a temperature of which is externally controlled. A temperature adjustment circuit controls the temperature of heat from the temperature adjustment element on the basis of the control signal.

6 Claims, 3 Drawing Sheets

LASER DIODE OPTICAL WAVELENGTH CONTROL APPARATUS

BACKGROUND OF THE INVENTION

The present invention relates to an optical wavelength control apparatus for controlling the optical wavelength of a light-emitting element, e.g., a laser diode, used in optical fiber communication.

For multi-channel wavelength multiplex transmission in the optical communication system, it is very important to control the oscillation center wavelength of the individual laser diode.

According to a method of controlling the oscillation center wavelength of a laser diode, the temperature of the diode element is changed. The temperature of a Peltier effect element increases or decreases in accordance with the direction and magnitude of a current flowing through the element. Accordingly, wavelength control of the laser diode can be performed by using this effect.

This method is currently often utilized in wavelength control of a laser diode. As an example, a laser wavelength control apparatus shown in Japanese Patent Laid-Open No. 8-37334 will be described with reference to FIG. 3.

A beam emitted by a laser diode 42 is input to an optical high-pass filter 46 and optical low-pass filter 51, both having a narrow band. The tuning wavelengths of the two optical filters 46 and 51 are set to sandwich a target optical center wavelength $\lambda$. Beams that have passed through the optical high-pass filter 46 and optical low-pass filter 51 are respectively converted into electrical signals by photodiodes (PDs) 48 and 53.

If the optical center wavelength is shifted to the long wavelength side due to some reason, the potential of the photodiode 48 connected to the optical high-pass filter 46 increases, and the potential of the photodiode 53 connected to the optical low-pass filter 51 decreases. These changes are detected by a comparator 56 to operate a temperature adjustment circuit 58. The temperature adjustment circuit 58 performs a control operation to increase (or decrease) the temperature of a Peltier effect element 41, thereby restoring the optical wavelength to the short wavelength range.

When the optical wavelength is shifted to the short wavelength side, the potential of the photodiode 48 connected to the optical high-pass filter 46 decreases, and the potential of the photodiode 53 connected to the optical low-pass filter 51 increases. These changes are detected by the comparator 56 to operate the temperature adjustment circuit 58. The temperature adjustment circuit 58 performs a control operation to decrease (or increase) the temperature of the Peltier effect element 41, thereby restoring the optical wavelength to the long wavelength side. Wavelength control of the laser diode 42 can be performed in this manner.

In the laser diode optical wavelength control apparatus described above, if the optical center wavelength is largely shifted to fall outside the range of the optical low-pass filter 51 or optical high-pass filter 46 for some reason (e.g., a power supply is turned on), outputs from the photodiodes 48 and 53 disappear and the output from the comparator 56 becomes unstable. Therefore, the optical wavelength of the laser diode 42 becomes uncontrollable.

In the wavelength control apparatus for the laser diode 42 described above, once the optical wavelength becomes uncontrollable, it cannot be restored to the controllable state.

SUMMARY OF THE INVENTION

It an object of the present invention to provide a photodiode optical wavelength control apparatus which, even when the optical center wavelength is largely shifted to fall outside the range of the optical low-pass filter or optical high-pass filter, can restore it to a controllable optical wavelength, thereby preventing an uncontrollable state.

In order to achieve the above object, according to the present invention, there is provided a laser diode optical wavelength control apparatus comprising a laser diode, optical branching means for branching a laser beam emitted by the laser diode into first, second, and third branched laser beams, a narrow-band first optical filter for receiving the first branched laser beam and transmitting a laser beam having a specific optical wavelength therethrough as a transmitted beam, second and third optical filters for receiving the second and third branched laser beams and transmitting laser beams having specific optical wavelengths therethrough as transmitted beams, first, second, and third photodiodes for converting output beams from the first, second, and third optical filters into electrical signals and outputting the electrical signals as analog voltages, comparator means for comparing the analog voltages output from the second and third photodiodes and outputting a signal representing a comparison result, differential amplifier means for performing differential amplification of a reference analog voltage obtained from the first photodiode and the output signal from the comparator means and outputting a control signal, a temperature adjustment element provided in tight contact with the laser diode and generating heat, a temperature of which is externally controlled, and temperature adjustment means for controlling the temperature of the heat from the temperature adjustment element on the basis of the control signal output from the differential amplifier means.

DESCRIPTION OF THE PREFERRED EMBODIMENT

The present invention will be described in detail with reference to the accompanying drawings.

Figure 1:
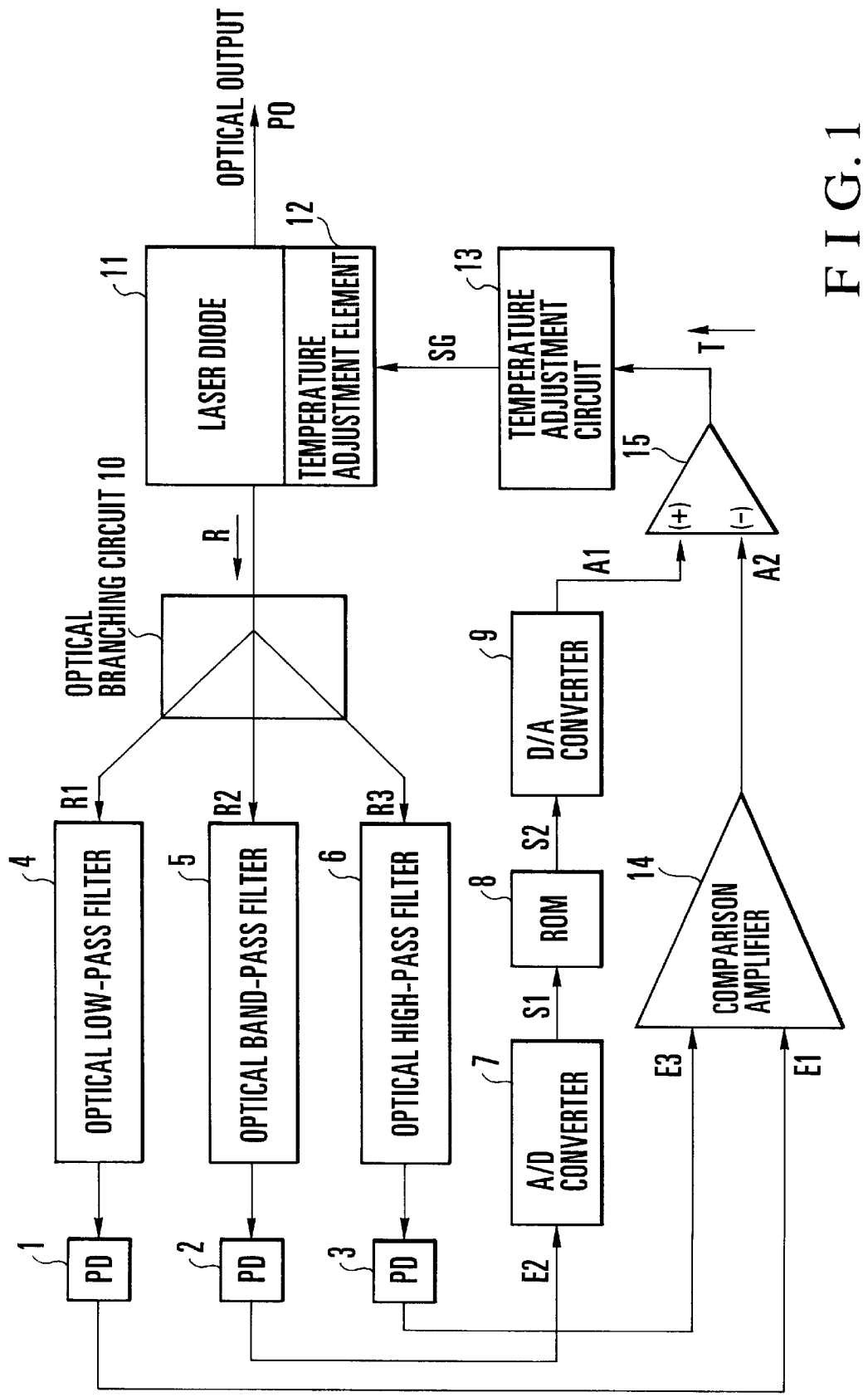
FIG. 1 is a block diagram of a laser diode optical wavelength control apparatus according to an embodiment of the present invention.

FIG. 1 shows a photodiode optical wavelength control apparatus according to an embodiment of the present invention. Referring to FIG. 1, a laser diode 11 emits a laser beam R. An optical branching circuit 10 comprises an optical coupler for branching the laser beam R output from the laser diode 11 into three beams, i.e., laser beams R1, R2, and R3 when adjusting the laser beam R.

An optical low-pass filter 4 receives the branched laser beam R1 and outputs it as an adjustment beam P1 having a target wavelength $\lambda 1$ or less. An optical band-pass filter 5 tunes the branched laser beam R2 to an adjustment beam P2 having a target center wavelength $\lambda$, and outputs it. An optical high-pass filter 6 receives the branched laser beam R3 and outputs it as an adjustment beam P3 having a target wavelength $\lambda 2$ or more.

Reference numerals 1 to 3 denote photodiodes (PDs). The photodiode 1 photoelectrically converts the controlled beam P1 into an analog voltage E1, and outputs it to a comparison amplifier 14. The photodiode 2 photoelectrically converts the controlled beam P2 into an analog voltage E2, and outputs it to an A/D converter 7. The photodiode 3 photoelectrically converts the controlled beam P3 into an analog voltage E3, and outputs it to the comparison amplifier 14.

The A/D converter 7 converts the analog voltage E2 output from the photodiode 2 into a digital signal S1, and writes it in a ROM (Read Only Memory) 8. The ROM 8 stores the digital signal S1 output from the A/D converter 7. A D/A converter 9 reads the digital signal S1 from the ROM 8 when adjusting the wavelength of the laser beam R, converts the readout digital signal S1 into an analog signal A1, and outputs it to a non-inverting input terminal (+) of an operational amplifier 15.

The comparison amplifier 14 compares the analog voltage E1 output from the optical low-pass filter 4 with the analog voltage E3 output from the optical high-pass filter 6, and outputs an analog signal A2 as a comparison amplification result to an inverting input terminal (−) of the operational amplifier 15. The operational amplifier 15 obtains the voltage difference between the analog signal A1 output from the D/A converter 9 and the analog signal A2 output from the comparison amplifier 14, amplifies the voltage difference, and outputs it as an output signal T to a temperature adjustment circuit 13.

The temperature adjustment circuit 13 calculates a value corresponding to the magnitude and polarity of the output signal T output from the operational amplifier 15, and outputs a control signal SG as a voltage indicating the calculation result to a temperature adjustment element 12. The magnitude and polarity of the current of temperature adjustment element 12 are controlled on the basis of the control signal SG output from the temperature adjustment circuit 13, so that the temperature of the heat generated by the temperature adjustment circuit 13 changes. Since the laser diode 11 is provided with the temperature adjustment element 12, comprising a Peltier element, to be in tight contact with it, its temperature is adjusted by the temperature adjustment element 12. By this temperature adjustment, the oscillation frequency of the laser beam R of the laser diode 11 is controlled.

Figure 2:
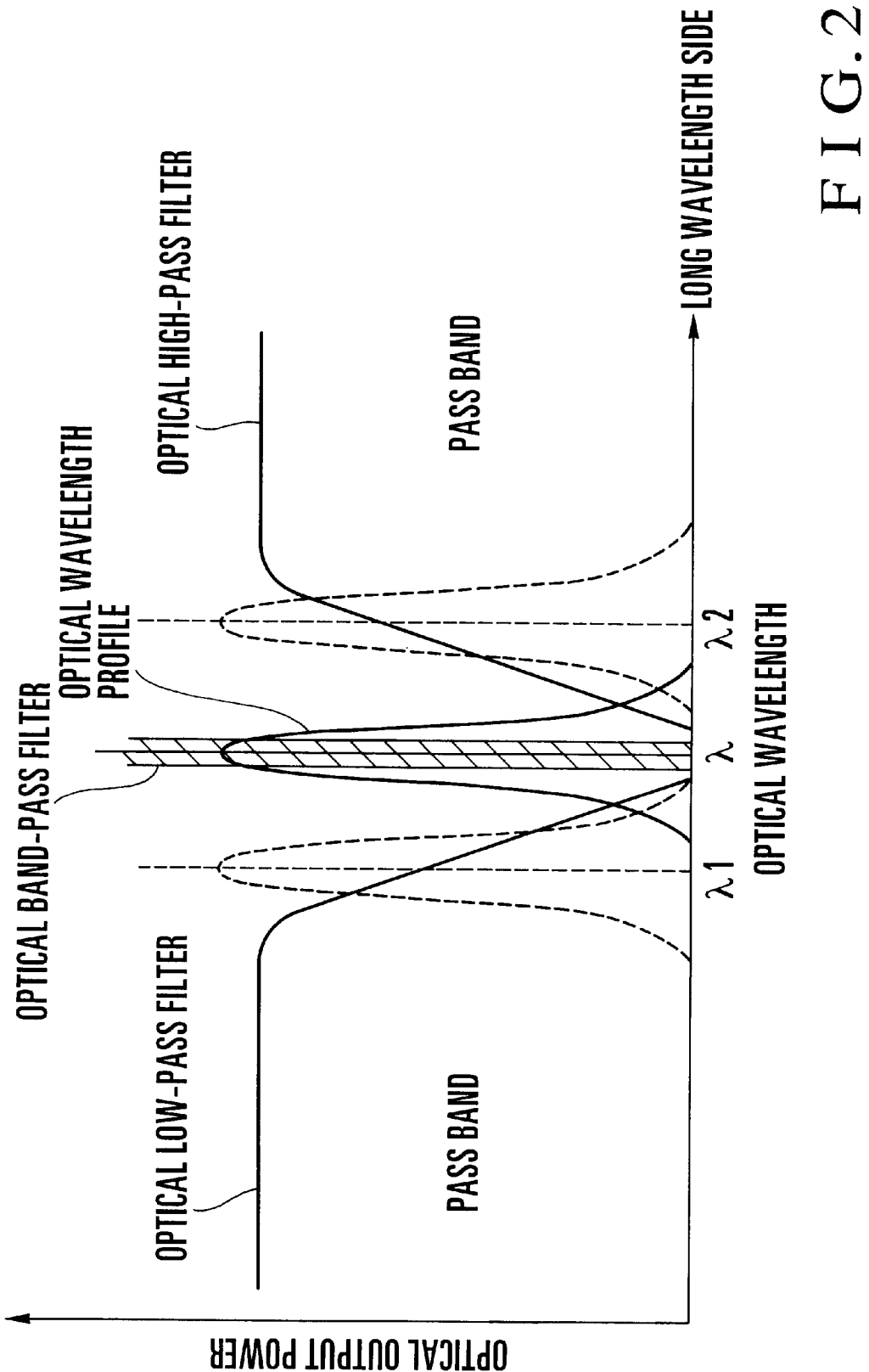
FIG. 2 is a graph showing the relationship between an optical wavelength and an optical output intensity in order to explain the operation of the laser diode optical wavelength control apparatus shown in FIG. 1.
Figure 3:
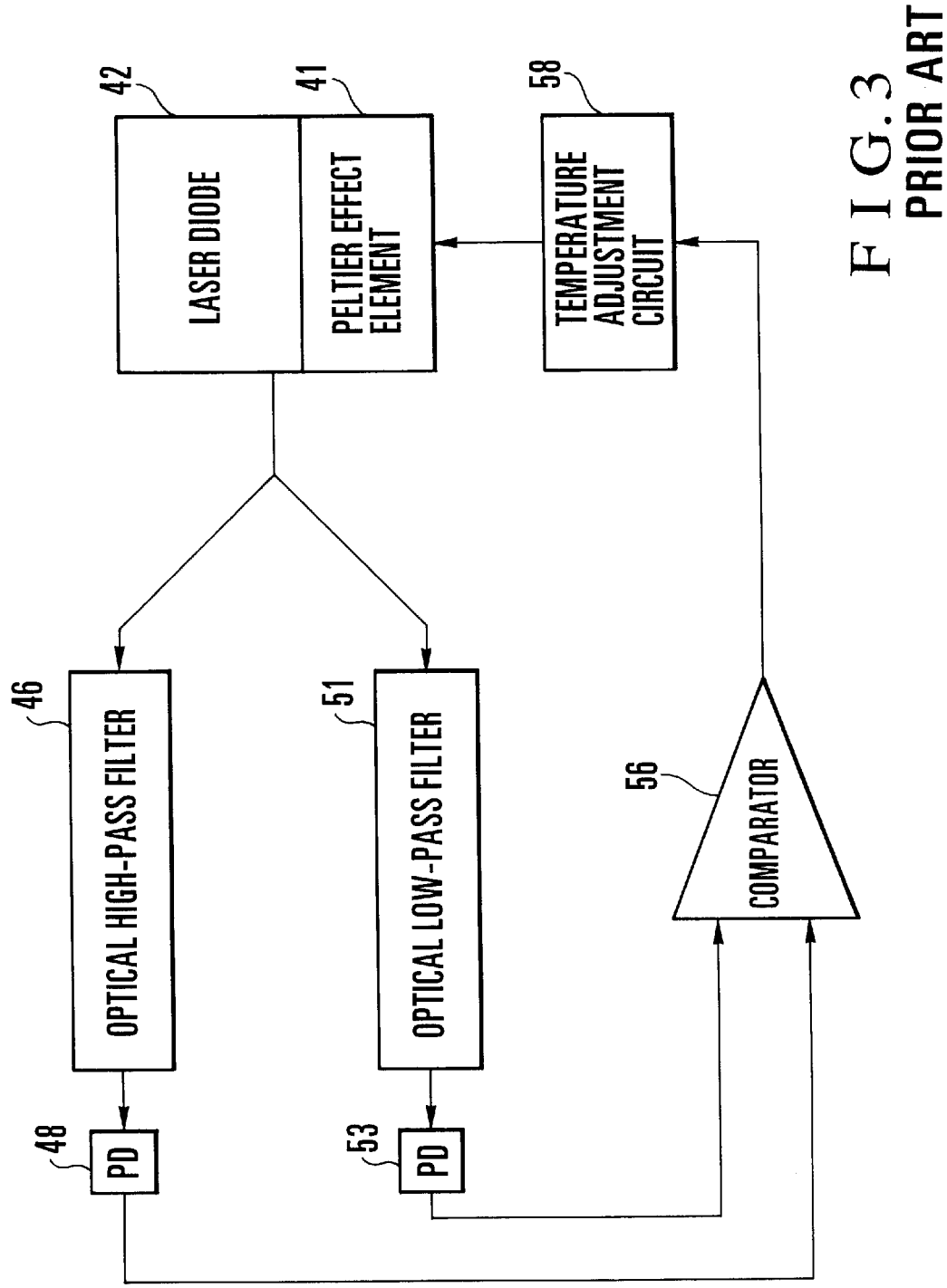
FIG. 3 is a block diagram of a conventional laser diode optical wavelength control apparatus.

The operation of the optical wavelength control apparatus shown in FIG. 1 will be described with reference to FIG. 2.

For example, assume that the optical center wavelength $\lambda$ of the laser beam R is shifted to the wavelength $\lambda 2$ in the long wavelength range for some reason. Since the peak of the optical waveform is located on a wavelength that can pass through the optical high-pass filter 6, the analog voltage E3 output from the photodiode 3 increases. Since the number of waves that pass through the optical low-pass filter 4 is small, the analog voltage E1 output from the photodiode 1 decreases.

Changes in two analog voltages E1 and E3 are detected by the comparison amplifier 14. As a result, the analog signal A2 output from the comparison amplifier 14 decreases (or increases). In other words, the direction of current flowing through the temperature adjustment element 12 is determined.

The controlled beam P2 output from the optical band-pass filter 5 is converted into the analog voltage E2 by the photodiode 2, and is written as a reference value in the ROM 8 in advance. This value is set such that the voltage output from the photodiode 2 becomes the maximum at the time of adjustment, and corresponds to the reference value which is controlled to the target center wavelength $\lambda$. The reference value read out from the ROM 8 is converted into the analog signal A1 by the D/A converter 9, and is output to the non-inverting input terminal (+) of the operational amplifier 15.

The operational amplifier 15 differentially amplifies the voltage difference between the analog values that are input to the non-inverting and inverting input terminals (+) and (−). More specifically, the analog signal A2 output from the comparison amplifier 14 is input to the inverting input terminal (−) of the operational amplifier 15, and is compared with the analog signal A1 of the reference value input to the non-inverting input terminal (+).

The output signal T from the operational amplifier 15 is output to the temperature adjustment circuit 13, and the temperature adjustment circuit 13 controls the magnitude and polarity of the current of the temperature adjustment element 12 such that the output signal T from the operational amplifier 15 coincides with the analog signal A1 which is to be input to the operational amplifier 15. More specifically, the operational amplifier 15 controls the temperature of the laser diode 11 such that the output from the comparison amplifier 14 becomes zero. As a result, feedback takes place so that the laser beam R from the laser diode 11 has a predetermined wavelength $\lambda$. This determines the magnitude and polarity of the current flowing through the temperature adjustment element 12.

Variations in optical wavelength of the laser diode 11 caused by an environmental temperature change, a temperature change caused by heat generated by the laser diode 11 itself, and the like are corrected, and the laser diode 11 outputs a laser beam PO at a constantly stable frequency.

When the optical center wavelength is shifted to the short wavelength side ($\lambda \rightarrow \lambda 1$), feedback control is performed in the same manner as described above, and the optical frequency of the laser diode 11 is corrected.

As described above, the optical high-pass filter 6 and optical low-pass filter 4 are set to have a wide band. Even when the optical wavelength of the laser diode 11 is largely shifted from the target value, the output from the comparison amplifier 14 does not become unstable, and optical wavelength control can be constantly performed.

Simultaneously, the magnitude of the controlled beam P2 output from the narrow-band optical band-pass filter 5 tuned to the target optical wavelength $\lambda$ is stored in the ROM 8 as a reference value, and feedback control is performed such that the controlled beam P2 constantly has the reference value, so that the stable optical center wavelength $\lambda$ can be output.

In the above embodiment, compensation is performed for both cases wherein the optical wavelength of the laser diode 11 is shifted to the long wavelength side and the short wavelength side. However, only either the long or short side of the optical wavelength may be compensated for by one wide-band low-pass or high-pass filter and one narrow-band band-pass filter.

According to the present invention, wide-band optical high-pass and low-pass filters and a narrow-band band-pass filter are provided. Even when the optical wavelength is largely shifted from a target value, the value of the laser beam output from the narrow-band band-pass filter is stored in the memory and feedback control is performed such that this value always becomes the stored value. As a result, a target optical center wavelength can always be maintained regardless of the environmental temperature change and deterioration over time of the laser diode.

What is claimed is:

1. A laser diode optical wavelength control apparatus comprising:

a laser diode;

optical branching means for branching a laser beam emitted by said laser diode into first, second, and third branched laser beams;

a narrow-band first optical filter for receiving the first branched laser beam and transmitting a laser beam having a specific optical wavelength therethrough as a transmitted beam;

second and third optical filters for receiving the second and third branched laser beams and transmitting laser beams having specific optical wavelengths therethrough as transmitted beams;

first, second, and third photodiodes for converting output beams from said first, second, and third optical filters into electrical signals and outputting the electrical signals as analog voltages;

comparator means for comparing the analog voltages output from said second and third photodiodes and outputting a signal representing a comparison result;

differential amplifier means for performing differential amplification of a reference analog voltage obtained from said first photodiode and the output signal from said comparator means and outputting a control signal;

a temperature adjustment element provided in tight contact with said laser diode and generating heat, a temperature of which is externally controlled; and temperature adjustment means for controlling the temperature of the heat from said temperature adjustment element on the basis of the control signal output from said differential amplifier means.

2. An apparatus according to claim 1, wherein said apparatus further comprises an A/D converter for converting a maximum analog voltage output from said first photodiode into a digital value during adjustment, a memory for storing the digital value output from said A/D converter as a reference value, and a D/A converter for converting the digital value stored in said memory into an analog value, and said differential amplifier means performs differential amplification of the analog value as the reference value output from said D/A converter and the output signal from said comparator means.

3. An apparatus according to claim 1, wherein said first optical filter is an optical band-pass filter, and said second and third optical filters are optical low-pass filter and an optical high-pass filter, respectively.

4. An apparatus according to claim 1, wherein said temperature adjustment element is a Peltier element.

5. An apparatus according to claim 1, wherein said optical branching means is an optical coupler.

6. An apparatus according to claim 1, wherein said differential amplifier means controls the temperature of said laser diode so that the control signal output from said differential amplifier means becomes equal to the reference voltage obtained by said first photodiode.

* * * * *